United States Patent
Lee et al.

(10) Patent No.: US 11,131,692 B1
(45) Date of Patent: Sep. 28, 2021

(54) LINE ISOLATING POWER CONNECTOR

(71) Applicant: Amazon Technologies, Inc., Seattle, WA (US)

(72) Inventors: Jared Lee, Marysville, WA (US); Huyen Van Nguyen, Bothell, WA (US); Richard Arvel Stevens, Auburn, WA (US); David Leonard Robinson, Alstonville (AU); Tong He, Beijing (CN); Hong Ghee Yow, Eastvale, CA (US); Xulong Zhan, Anhui Province (CN); Xia Yang, Anhui Province (CN)

(73) Assignee: Amazon Technologies, Inc., Seattle, WA (US)

( * ) Notice: Subject to any disclaimer, the term of this patent is extended or adjusted under 35 U.S.C. 154(b) by 101 days.

(21) Appl. No.: 16/392,089

(22) Filed: Apr. 23, 2019

(51) Int. Cl.
| | | |
|---|---|---|
| *G01R 31/04* | (2006.01) | |
| *G01R 15/14* | (2006.01) | |
| *G01R 1/04* | (2006.01) | |
| *H01R 24/30* | (2011.01) | |

(52) U.S. Cl.
CPC ......... *G01R 15/146* (2013.01); *G01R 1/0416* (2013.01); *H01R 24/30* (2013.01)

(58) Field of Classification Search
CPC ............... G01R 15/146; G01R 1/0146; G01R 1/06788; G01R 19/00; G01R 19/0023; G01R 19/003; G01R 19/0038; G01R 19/0094; G01R 19/0092; H01R 24/30; H01R 13/665; H01R 25/003
See application file for complete search history.

(56) References Cited

U.S. PATENT DOCUMENTS

| | | | | |
|---|---|---|---|---|
| 7,104,813 B1 * | 9/2006 | Chuang | ................. | H01R 35/04 439/104 |
| 7,311,558 B2 * | 12/2007 | Adams | ................... | H01R 13/64 439/680 |
| 7,484,972 B1 * | 2/2009 | Kuo | ....................... | H01R 35/04 439/131 |
| 7,726,825 B2 * | 6/2010 | Mandapat | .......... | H01R 13/7175 362/95 |
| 8,221,154 B1 * | 7/2012 | Paquette | .............. | H01R 13/665 439/488 |
| 8,638,087 B2 * | 1/2014 | Elberbaum | .......... | G01R 15/183 324/76.11 |
| 2018/0269602 A1 * | 9/2018 | Otto | ..................... | H01R 4/4845 |

\* cited by examiner

*Primary Examiner* — Thang X Le
(74) *Attorney, Agent, or Firm* — Kilpatrick Townsend & Stockton LLP

(57) ABSTRACT

A line isolating power connector can include a housing for connecting with a power cable and a power source, and wires positioned through the housing that include at least a line wire and a neutral wire. The housing is separated by an aperture into a line conduit and a neutral conduit, and the aperture is sized to receive a portion of a contactless power quality probe such that the power quality probe can be connected around the first line conduit or neutral conduit in order to measure power quality in either the line wire or the neutral wire.

10 Claims, 9 Drawing Sheets

LINE ISOLATING POWER CONNECTOR

BACKGROUND

Electrical power connectors used in various commercial, industrial, datacenter, or home applications employ insulated power cabling to prevent accidental contact between powered lines and users. In particular, for high-voltage applications including, e.g., datacenter, utility, or industrial equipment, wires and circuitry are typically concealed within cabling and connector housings as part of compliance with safety regulations. The various ways in which wires are bundled and insulated prevent electromagnetic interference and provide protection, but can also impede the use of most measuring devices to confirm power quality in any given electrical power line. This challenge is exacerbated in infrastructure that contains numerous power connections, where line tracing and the identification of active and inactive power connections can take a significant amount of time. For at least these reasons, devices that could streamline identification of active and inactive power connections are needed.

BRIEF DESCRIPTION OF THE DRAWINGS

Various embodiments in accordance with the present disclosure will be described with reference to the drawings, in which.

DETAILED DESCRIPTION

Figure 1:
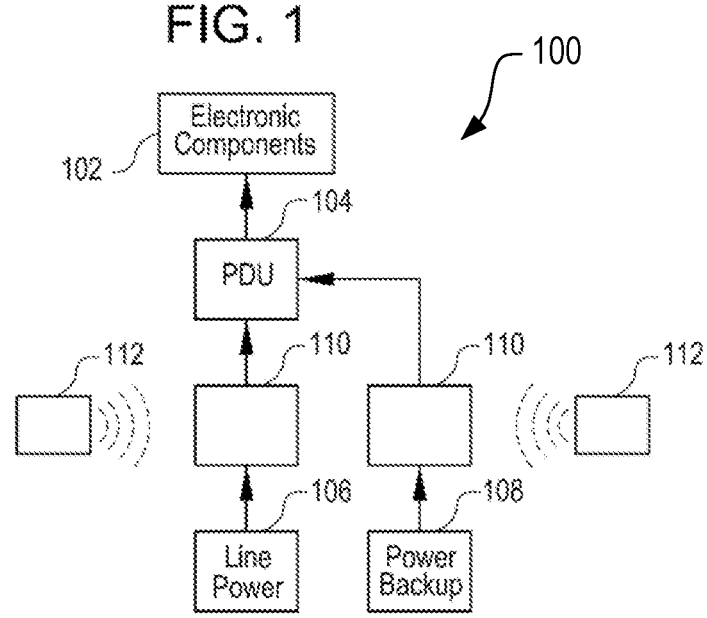
FIG. 1 is a simplified block diagram illustrating an example electrical system employing a line isolating power connector, in accordance with various embodiments of the present disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

According to various embodiments of the present disclosure, a line isolating power connector can include a housing, such as a plastic, rubber, or other insulating housing, that routes one or more line wires (e.g., signal and/or current-carrying wires) separately from neutral or protective earth/ground (PE/G) wires. For example, in various embodiments, the housing is placed at an end of a current-carrying cable, and wires within the current-carrying cable are separated within the housing and separately routed therein. The housing is shaped with an aperture that, for a finite length, divides the housing into at least two separated sections that form separated conduits for wiring, one conduit containing the neutral and/or PE/G wires but no line wires, and at least one other conduit containing one or more line wires but no neutral or PE/G wires. In some embodiments directed to multi-phase power distribution, the housing can have multiple apertures that define multiple separate line-wire conduits for containing line wires operating at different phases from each other.

Line isolating power connectors can be installed in or otherwise connected with power connecting cables for electronic systems. For example, in one embodiment, a line isolating power connecter can replace a conventional plug at an end of a power connecting cable. The geometry of housing, particularly with respect to the aperture(s) and conduits, is shaped to permit the use of a contactless sensor such as an AC current sensor, hall effect sensor, or other suitable sensor that can measure an aspect of power quality when positioned around an active line wire, but not when positioned around a collection of line and neutral wires or line and PE/G wires.

When a line isolating power connector is installed with a current-carrying cable, e.g. by replacing a conventional plug with the line isolating power connector, a technician can use a contactless sensor in conjunction with the line conduit(s) of the power isolating connector in order to measure an aspect of power quality through the current-carrying cable without unplugging the cable. For example, with an AC current sensor, the technician could determine whether a power supply to the current-carrying cable has been disconnected, or likewise with a DC current sensor. Suitable applications for this technique include, e.g., troubleshooting power connectivity issues in large-scale electronic systems like datacenters or the like, detecting whether it is safe to disconnect a power cable, or determining how much current or voltage may be carried by a power cable without having to disconnect the power cable. Particularly in datacenter environments, power can be disconnected from a power source to the load (e.g., servers, switches, or other electronic components) either upstream or downstream of the power cable, via either hardware or software methods, therefore it can be difficult to confirm whether power to a particular component or through a particular power cable has been disconnected. In another example, contactless sensors can be used in conjunction with a line-isolating power connector by a technician to test the current level (Amps) of an electronic device power distribution unit to confirm whether the current load is within safe levels, or to confirm additional load (e.g., additional electronic devices) can be added. Similarly, a technician may use a line-isolating power connector to permit efficient checks of the current load on mechanical devices or to confirm whether the current matches the rating of device, as an overloaded motor will pull excess current.

FIG. 1 is a simplified block diagram illustrating an example electrical system 100 employing a line isolating power connector 110 in accordance with various embodiments of the present disclosure. Although embodiments are described principally with reference to datacenter applications, it will be understood that the devices and methods disclosed herein can be used in conjunction with any electronic device, including industrial, commercial, and consumer electronics. According to various embodiments, an electrical system 100 includes any suitable number of electronic components 102 that can include, e.g., datacenter components, servers, switches, industrial equipment, appliances, batteries or other comparable energy storage devices, utility interconnects that receive electrical power, or other devices that draw electrical power.

Electrical components 102 can be provided electrical power by way of one or more power distribution units (PDUs) 104, e.g. transformers, power conditioners, splitters, or the like. In some embodiments, for example, PDUs 104 can include automatic transfer switches (ATS) that draw power from multiple sources to ensure a consistent power supply. Power to the electronic components 102 can be received from a line power source 106, such as a utility power source that might be an alternating current (AC) power source or a direct current (DC) power source. Alternatively, power can also be supplied to the system 100 by way of any suitable number of backup power sources 108, such as a battery power source (typically DC).

In some embodiments, e.g. in datacenter applications, the electronic components 102 include a collection of servers and server equipment served by multiple, potentially many, PDUs that connect with the power sources 106, 108 by way of insulated electrical connecting cables. The electrical connecting cables are often routed above or below the servers, sometimes above the datacenter ceiling or below a datacenter floor, so as to protect the cables from unauthorized access, to reduce clutter, to improve airflow, to make the servers more accessible, or for other reasons.

Line isolating power connectors 110 can be installed into power connecting cables that connect one or more of the various power sources (106, 108) to the power distribution unit 104, or alternatively, between any other electrical connection within the system. The line isolating power connectors 110 are configured to receive power quality probes 112, which can include various forms of sensors that can be used to measure an attribute of power quality through the electrical connecting cable to which the line isolating power connector is attached. For example, suitable power quality probes can include probes for measuring current, voltage, signal, or other attributes of electrical power in a line without having to directly touch the line. In conjunction with the line isolating power connectors 110, power quality probes 112 can be used to measure a power quality attribute in an electrical connecting cable without disconnecting, stripping, or otherwise modifying the cable, thus permitting rapid identification of live and unpowered electrical connecting cables by a technician.

Figure 2:
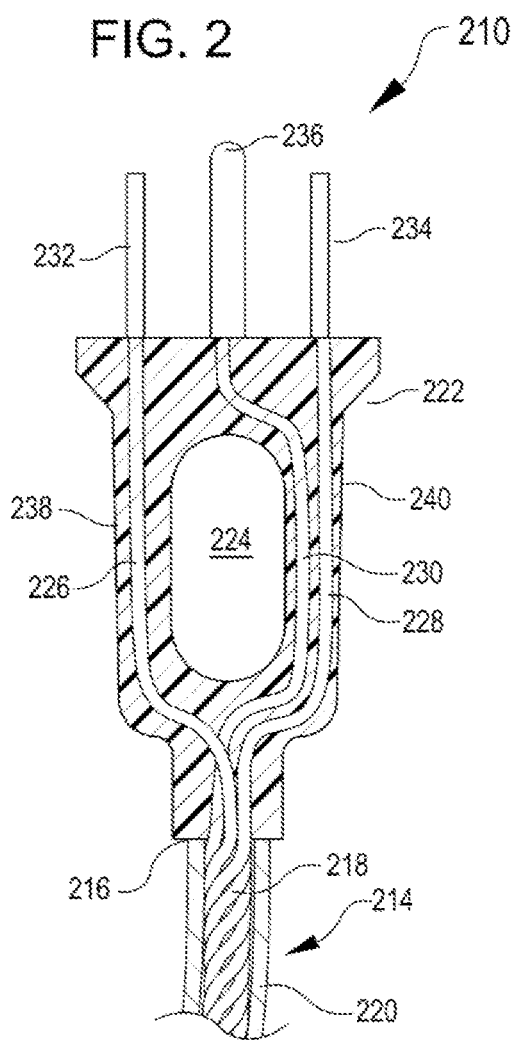
FIG. 2 is a top section view illustrating a first example of a line isolating power connector for an electrical connecting cable.

FIG. 2 is a top section view illustrating a first example of a line isolating power connector 210 for an electrical connecting cable 214. Unless otherwise noted, similar enumeration across figures is used herein to indicate similar or compatible components across figures, e.g. line isolating power connectors 110, 210 (FIGS. 1, 2).

According to various embodiments, a power connecting cable 214 terminates in a line isolating power connector 210 at a cable terminus 216. The power connecting cable 214 contains cable wiring 218, which is often braided or wound for strength, flexibility, and/or to reduce electromagnetic interference (EMI). The cable wiring 218 is covered with one or multiple layers of insulated cable covering 220. In some embodiment, the insulated cable covering 220 can include one or more electrically insulating materials (e.g. flexible plastic or rubber tubing) and/or structural materials such as a textile casing. At the terminus 216, the power connecting cable 214 feeds into a line isolating power connector housing 222. According to some embodiments, the housing 222 can be a soft plastic, hard plastic, rubber, thermoplastic resin, or other comparable, electrically insulating material suitable for use as the plug end of the power connecting cable 214.

The housing 222 of the isolating power connector 210 includes an aperture 224 that defines at least two separated conduits, e.g. a line-side conduit 238 and a neutral-side conduit 240. According to various embodiments, the conduits 238, 240 can be hollow portions of the housing 222 through which the wiring can be routed, either as individual wires or as bundled wiring. The conduits 238, 240 may also include additional structures for managing wire routing, or for otherwise protecting or insulating electrical wiring. Each conduit 238, 240 may include multiple sub-conduits therein for containing wires routed in parallel through the same conduit, or may contain multiple insulated wires running in parallel therethrough. The conduits 238, 240 are sufficiently hollow to at least contain a collection of wires originating from the power connecting cable 214. In some embodiments, the conduits 238, 240 can be hollow passages formed in the housing 222 through which insulated wiring is routed; but alternatively, the housing can be formed around the wiring so as to leave little or no empty space. In various embodiments, the isolated power connector 210 contains a first line wire 226 from the power connecting cable, which is routed through the line-side conduit 238, and a neutral wire 228 routed through the neutral-side conduit 240. The first line wire 226 and neutral wire 228 can also be described as the current-carrying wire and return current-carrying wire. As described herein, "wire" can refer to a single filament or to a bundle carrying the same signal.

Not all embodiments necessarily contain a protective earth or ground wire (PE/G). However, in addition to the neutral wire 228, if a PE/G wire or wires are present, PE/G wiring 230 may also be routed through the neutral-side conduit 240. According to some alternative embodiments, the PE/G wiring 230 may be instead routed through the line-side conduit 238. The first line wire 226 is connected with and terminates at a line terminal 232, e.g. a contact element, conventional prong of a plug, or other suitable terminal. Likewise, the neutral wire 228 can connect with and terminate at a neutral terminal 234. In embodiments that include a PE/G wire 230, the PE/G terminal can connect with and terminate at a PE/G terminal 236. The line terminal 232, neutral terminal 234, and PE/G terminal 236 can be arranged as plugs in a conventional or standard configuration, shown herein as a standard U.S. outlet three-prong configuration, but usable in a variety of other conventional configurations. Suitable configurations that comply with specialized industry standards or non-U.S. plug standards are also within the scope of the embodiments described herein.

Figure 3:
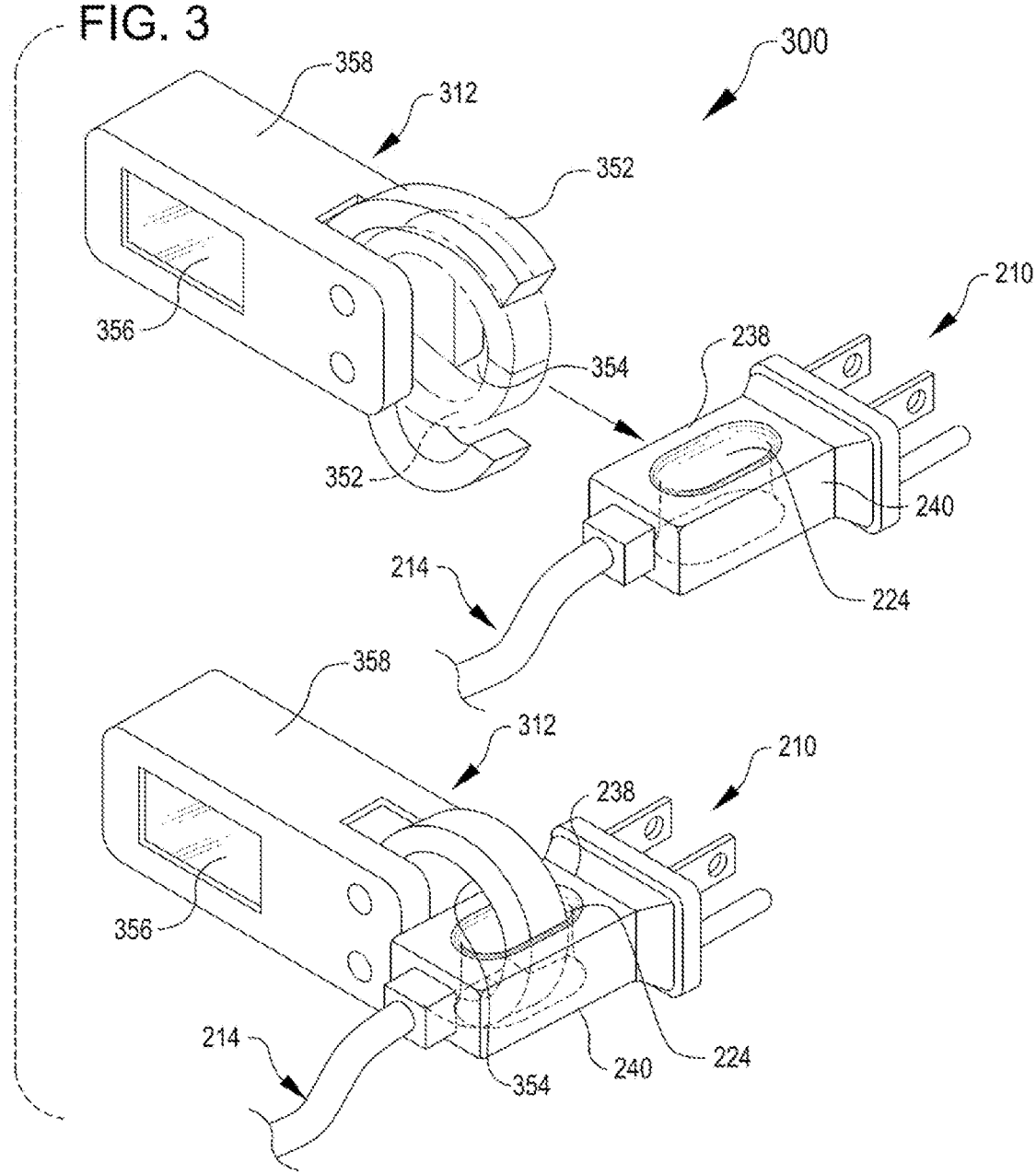
FIG. 3 is a perspective view of the line isolating power connector of FIG. 2, illustrating compatibility between the line isolating power connector and a power quality probe.

The line-side and neutral-side conduits 238, 240 are configured to be compatible with a suitable contactless power quality sensor or probe. For example, FIG. 3 is a perspective view of the line isolating power connector 210 of FIG. 2, illustrating compatibility between the line isolating power connector and a power quality probe 312. As shown also in FIG. 2, a power connecting cable 214 terminates at the line isolating power connector housing 222. The line isolating power connector housing 222 contains an aperture 224 that defines the line-side conduit 238 and neutral-side conduit 240.

With the line isolating power connector 210 in use, e.g. installed with a power-conducting cable and plugged in to a power source, a user can employ a contactless power quality probe 312 to detect power quality in the power connecting cable 214 by separately probing the line-side conduit 238, the neutral-side conduit 240, or both. A suitable contactless power quality probe 312 can include a variety of current and voltage-measuring devices that operate without direct contact with a live wire. For example, according to some embodiments, the power quality probe 312 contains a current transformer that senses A/C current. In some embodiments, the power quality probe 312 may contain a hall effect sensor, or similar sensor, that detects DC current. In some embodiments, the power quality probe 312 might include a contactless voltage probe, either for determining voltage of a powered cable or that might be used to detect signals in a data-transmitting cable. For example, in systems that employ polyphasic power supplies, a voltage probe may be used to determine whether an electrical cable has voltage across each of the multiple phases, or whether the voltages in the various phases are balanced with each other.

A wide variety of contactless power quality probes may be compatible with the line isolating power connector 210. One class of power quality probes is depicted as probe 312, in which the probe includes a probe body 358 having two pivotally connected prongs 352 that can open and close about either the line-side conduit 238 or neutral-side conduit 240 of the probe. The prongs 352, when closed together, define an opening 354 in which the selected conduit is inserted, at which time the probe can measure the current, voltage, or other power quality measure of the enclosed wire or wires inside the selected conduit and display information on the probe display 356. Other configurations of contactless power quality probes may also be compatible with the line isolating power connector 210. For example, some types of power quality probes include notched designs that do not need to fully enclose a probed power supply wire, or wire-based designs that can be wound around the probed power supply wire.

The specific shape of the aperture 224 and the size of the conduits 238, 240 can be varied to accommodate the preferred type of power quality probe, e.g. with apertures that can vary in shape between elongated ellipsoidal shapes, circular shapes, or substantially rectangular shapes. In some cases, the conduits 238, 240 can have a substantially rectangular cross-section, circular cross-section, elliptical cross-section, discorectangular cross-section, or other suitable shape. In some embodiments, the conduits 238, 240 can be cylindrical along some or all of their length.

The dimensions of the aperture 224 can be varied to accommodate standard power quality probes of various sizes. In some embodiments, the aperture 224 can have a long dimension (i.e., parallel to the conduits 238, 240) of about 2.5 cm to about 6.25 cm (1-2.5"), or from about 1.25 cm to about 6.25 cm (0.5-2.5"). According to some embodiments, the aperture 224 can also have a width (i.e., orthogonal to the conduits 238, 240) from about 2.5 cm to about 6.25 cm (1-2.5"), or from about 1.25 cm to about 6.25 cm (0.5-2.5"). The exact dimensions of the aperture can vary, and the length and width thereof may be different. The conduits 238, 240 can range in diameter to accommodate portable, contactless power quality probes of various sizes; but according to some embodiments, the conduits 238, 240 can range from about 13 mm to about 41 mm. According to some embodiments, the conduits 238, 240 can be electromagnetically unshielded to permit more accurate readings of power quality within the line wire 226 or neutral wire 228. The unshielded length is nonzero and can span the length of each conduit, but is generally less than 15 cm.

Figure 4:
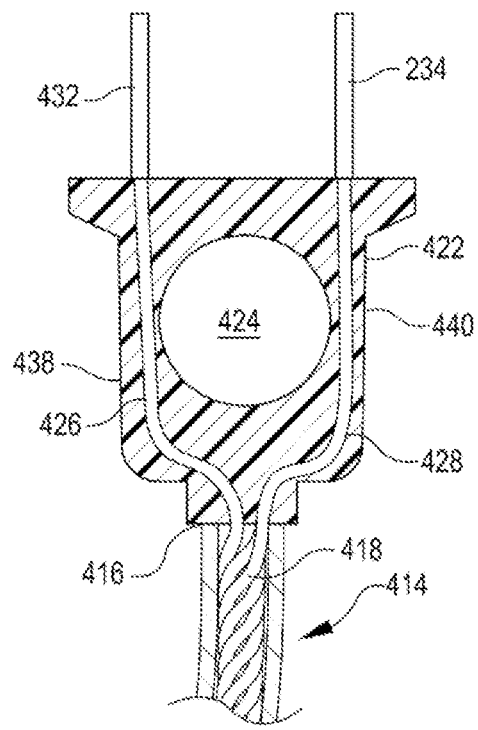
FIG. 4 is a top section view illustrating a second example of a line isolating power connector having an ungrounded configuration.

Embodiments may also be configured for suitability in the home use environment, e.g. for consumer devices or appliances or low-voltage applications, with or without PE/G connections. For example, FIG. 4 is a top section view illustrating a second example of a line isolating power connector 410 having an ungrounded configuration. Similar to the line isolating power connector 210 shown in FIG. 2, line isolating power connector 410 is connected with an electrical connecting cable 414 at the cables terminus 416. Cable wiring 418, may be parallel, braided, or wound to reduce EMI, and may or may not include additional insulation beyond a cable cover. The cable wiring 418 feeds into the line isolating power connector housing 422.

In the housing 422 of the line isolating power connector 410, an aperture 424 defines a first, line conduit 438 and a second, neutral and/or PE/G conduit 440. As the cable wiring 418 passes through the housing 422, the line wiring 426 is diverted to the line conduit 438 and the neutral wiring 428 is diverted to the neutral conduit 440. The aperture 424 is shown herein as circular, although the specific dimensions and shape of the aperture may vary, or may be adapted to match dimensions of various commercially available power quality probes. In particular, the aperture 424 is sized in conjunction with the shape of the housing 422 so that each of the conduits 438, 440 has a sufficiently small cross section and sufficient length to permit the application of a contactless power quality probe, as discussed above with reference to FIG. 3. The first line wire 426 terminates at a line terminal 432, and the neutral wire terminates at a neutral terminal 434 suitable for connection with a power supply, such as but not limited to a standard commercial outlet, industrial outlet, or other power supply.

Figure 5:
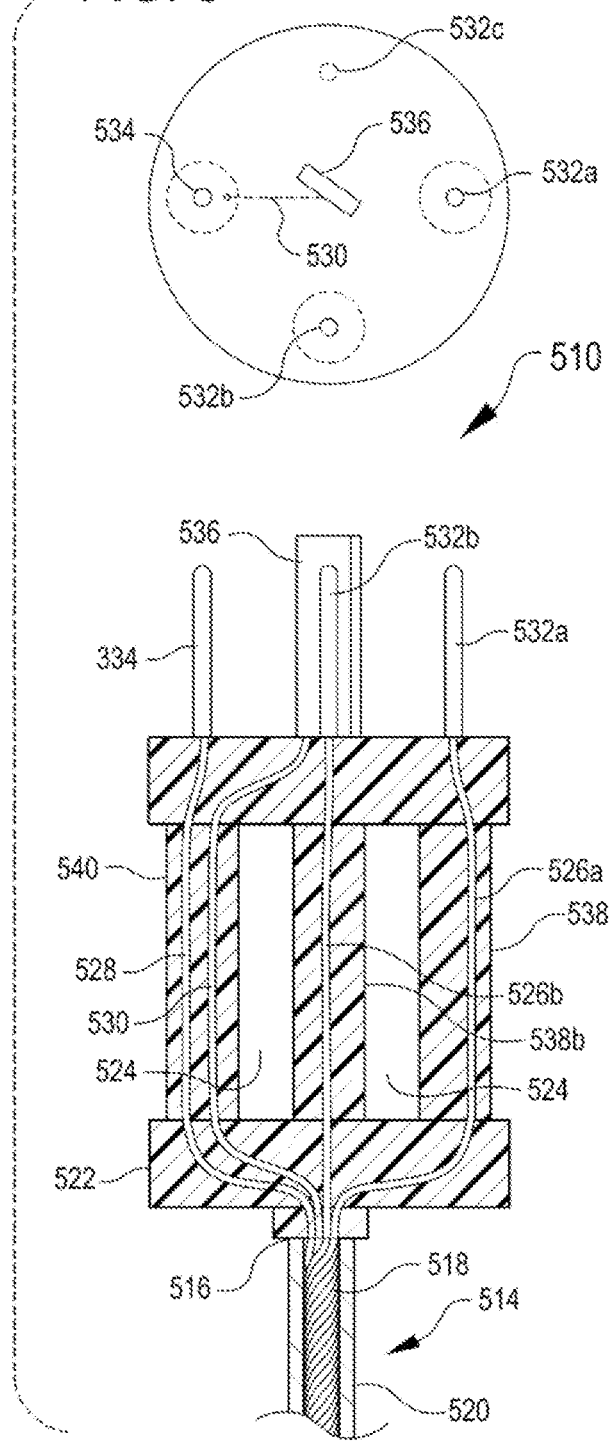
FIG. 5 is a top section view illustrating a third example of line isolating power connector configured to accommodate multiple line power phases.

FIG. 5 is a top section view illustrating a third example of line isolating power connector 510 configured to accommodate multiple line power phases. In a similar manner to the line isolating power connectors described above, line isolating power connector 510 can take the place of a power cable plug at the cable terminus 516 of a power connecting cable 514. The power connecting cable 514 includes cable wiring 518, which is often braided or wound for strength, flexibility, and/or to reduce electromagnetic interference (EMI), covered by one or more forms of insulated cable covering 520, which can include simple electrically insulating materials, or optionally include additional layers for electrical shielding or for imparting strength or wear resistance. In configurations that accommodate multiple power phases, the cable wiring 518 can include separate wires carrying current at each distinct phase.

The cable wiring 518 is routed through the line isolating power connector housing 522, separated, and passed separately through multiple conduits 538a, 538b, 540 that are separated by an aperture 524 in the housing. A first line wire 526a can be routed through a first line conduit 538a, a second line wire 526b can be routed through a second line conduit 538b, and a neutral wire 528 can be routed through a neutral conduit 540. In embodiments that also include a protective earth or ground wire (PE/G) 530, this wiring can also be passed through the neutral conduit 540, or can optionally be passed through an additional, separate conduit (not shown). Each respective set of wiring can terminate at a respective terminal, e.g., the first line wire 526*a* at a first line terminal 532*a*, the second line wire 526*b* at a second line terminal 532*b*, the neutral wiring 528 at a neutral terminal 534, and the PE/G wiring 530 at a PE/G terminal 536. The terminals can be arranged to comply with any suitable, conventional, or standard plug configurations. In addition, other embodiments of a multiphase line isolating power connector 510 can employ any suitable number of additional conduits for isolating additional line wires. For example, in embodiments having more than two phases, the requisite additional wiring may terminate at an optional third line terminal 532*c*. Additional conduits and terminals may be added for complex or industry-specific systems that use more than three phases.

The various embodiments and their variations described above include line isolating power connectors that are integrally connected with a terminal end of a power connecting cable in a manner that replaces the plug at the end of the cable. For example, according to various embodiments, the line isolating power connector being integrally connected with the power cable includes that electrically conductive wiring passing through the cable is contiguous from the cable, through the line isolating power connector, to the terminals or contacts. The housing of the line isolating power connector can be formed around, adhered to, or otherwise permanently fixed to the electrically conductive cable and/or around any insulating layers surrounding the cable, so as to provide complete electrical insulation around any conductive wiring and to prevent liquid intrusion into the cable or housing. The illustrated embodiments show a variety of plug configurations, but it will be understood that line isolating power connectors can equally replace any suitable inlet or receptacle configuration, including all suitable varieties of blade, pin, and contact configurations.

Any of the embodiments of line isolating power connectors described above may be used for, e.g., maintenance or diagnostic tasks with respect to any suitable electronic device, or in conjunction with a facility containing potentially many electronic devices such as a datacenter. Processes for assembling and using exemplary embodiments of line isolating power connectors are described below with reference to FIGS. 6, 7, and 8.

Figure 6:
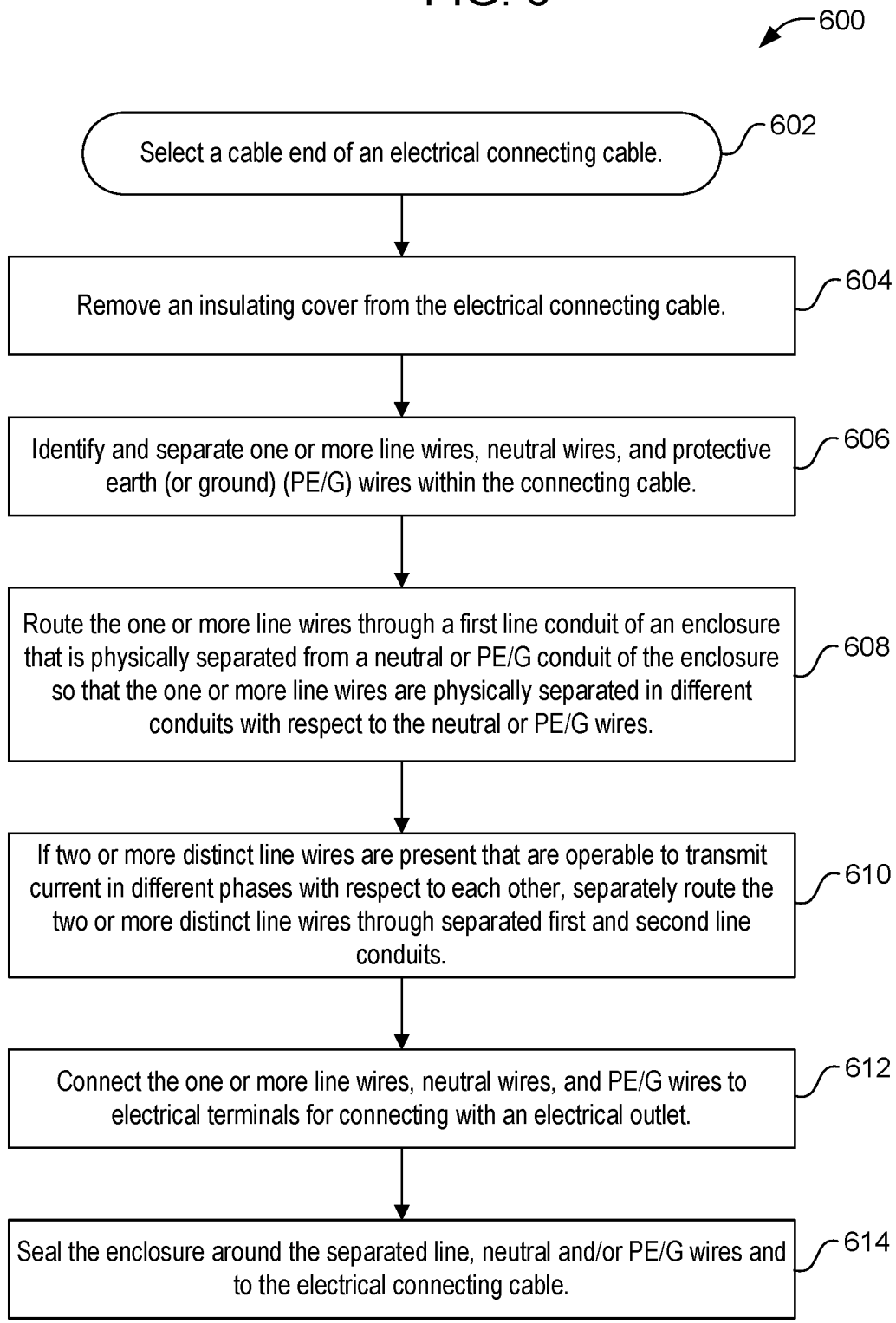
FIG. 6 illustrates an example process for installing a line isolating power connector with an electrical connecting cable.

FIG. 6 illustrates an example process 600 for installing a line isolating power connector with an electrical connecting cable, and in accordance with any of the embodiments of line isolating power connectors described herein. For example, according to various embodiments, the line isolating power connector can be installed by selecting a cable end of an electrical connecting cable (Act 602) and removing an insulating cover from the electrical connecting cable (Act 604). Any number of line wires, neutral wires, and protective earth (or ground) (PE/G) wires within the connecting cable can then be separated (Act 606), and routed independently through the appropriate conduit in the enclosure of the line isolating connector. For example, a line wire can be routed through the first line conduit of the enclosure that is physically separated from a neutral or PE/G conduit of the enclosure so that the one or more line wires are physically separated in different conduits with respect to the neutral or PE/G wires (Act 608). In multiphase embodiments, where two or more distinct line wires are present that are operable to transmit current in different phases with respect to each other, the line wires can be separately routed through separated first and second line conduits (Act 610).

Once the line, neutral, and/or PE/G wiring has been routed separately through appropriate, separated conduits in the enclosure of the line isolating power connector, the respective line wires, neutral wires, and PE/G wires can be electrically connected to electrical terminals for connecting with an electrical outlet (Act 612). Once assembled, the line isolating power connector can be sealed, e.g. to be watertight and/or splash resistance, or to provide additional physical support against breakage during handling by sealing the enclosure around the separated line, neutral and/or PE/G wires and to the electrical connecting cable (Act 614).

In use, the line isolating power connector or line isolating power connector can be used to facilitate rapid identification of current or voltage in a power cable, or in some cases by identifying additional information about the current or voltage therein (e.g., identifying properties of an AC current such as voltage, frequency, current, etc., identifying properties of a DC current such as voltage or current, and/or identifying signals in either an AC or DC current), or identifying properties in an AC current or a signal-carrying current such as but not limited to harmonic distortion. One such example process for scanning an electrical connecting cable is described below with reference to FIG. 7.

Figure 7:
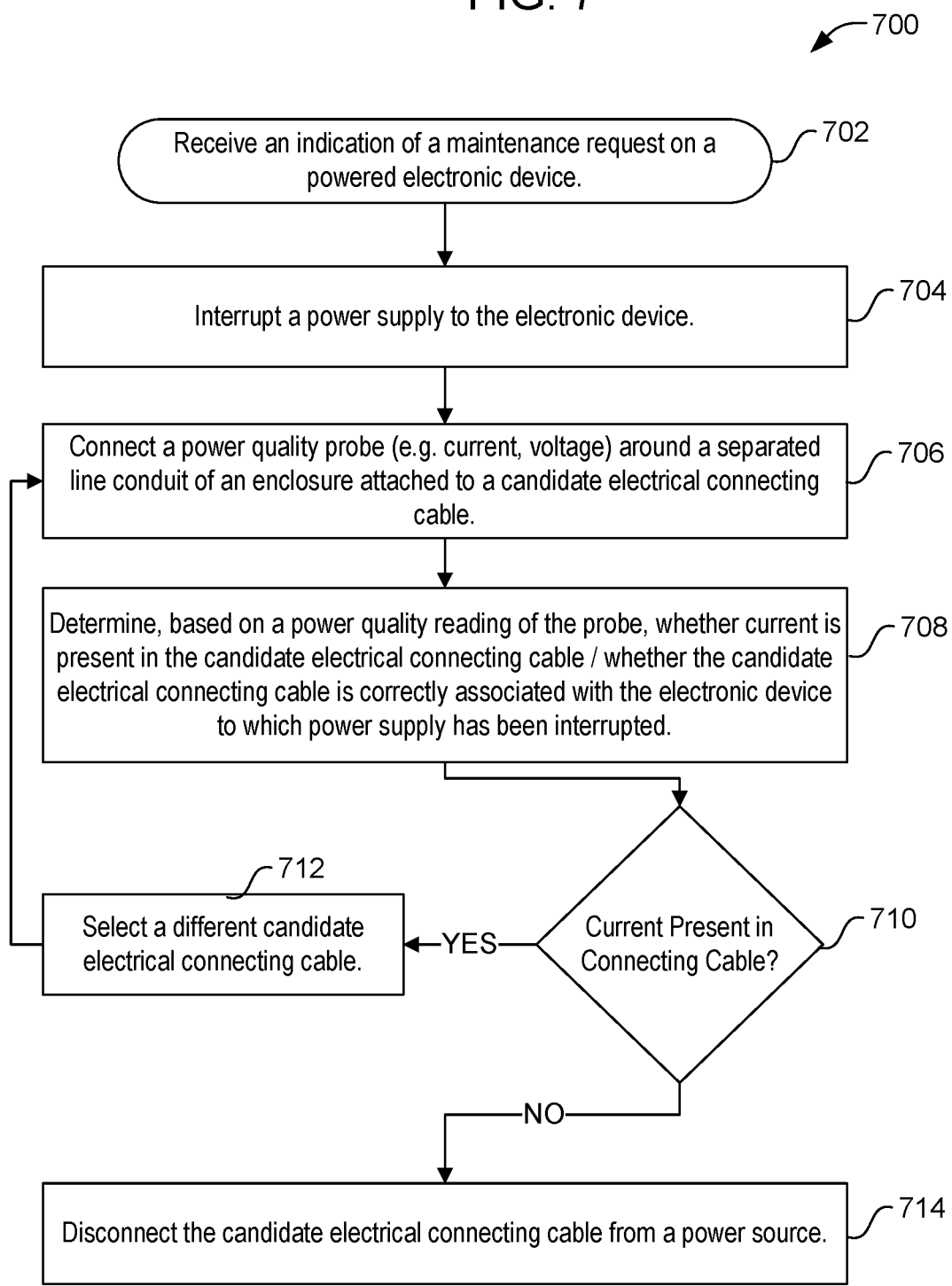
FIG. 7 illustrates an example process for detecting current or voltage in an electrical connecting cable using a power quality probe in conjunction with a line isolating power connector.

FIG. 7 illustrates an example process 700 for detecting current or voltage in an electrical connecting cable using a power quality probe in conjunction with a line isolating power connector, and in accordance with any of the embodiments of line isolating power connectors described herein. Steps shown in process 700 can be performed in conjunction with systems for maintaining operations in a datacenter or other suitable facility that includes any suitable degree of automation or on-demand maintenance scheduling. For example, according to various embodiments, an indication of a maintenance request can be received with reference to an electronic device (Act 702). In order to facilitate disconnection of the electronic device for maintenance or diagnostics, a power supply to the electronic device is interrupted, e.g. in software or at a switch (Act 704). An appropriate electrical connecting cable is identified as a candidate (e.g., by tracing a cable believed to originate from the selected electronic device), and a power quality probe (e.g. a probe for measuring current, voltage, and/or signal) is connected around the line conduit of a line isolating power connector of the candidate electrical connecting cable (Act 706).

According to some embodiments, a power quality reading of the probe can be read directly, e.g. by a technician or user, and used to determine whether current is present in the candidate electrical connecting cable, and therefore whether the candidate electrical connecting cable is correctly associated with the electronic device to which power supply has been interrupted (Act 708). If current is present in the cable (Act 710), it can be inferred that either the candidate electrical connecting cable is not the correct cable, or that the power supply was not correctly interrupted, in which case a different candidate electrical connecting cable can be selected (Act 712) or the disconnection procedure can be rechecked. If current is not present in the candidate electrical connecting cable, it can be inferred that the cable was selected correctly and that it is safe to disconnect the candidate electrical connecting cable from a power source (Act 714).

Figure 8:
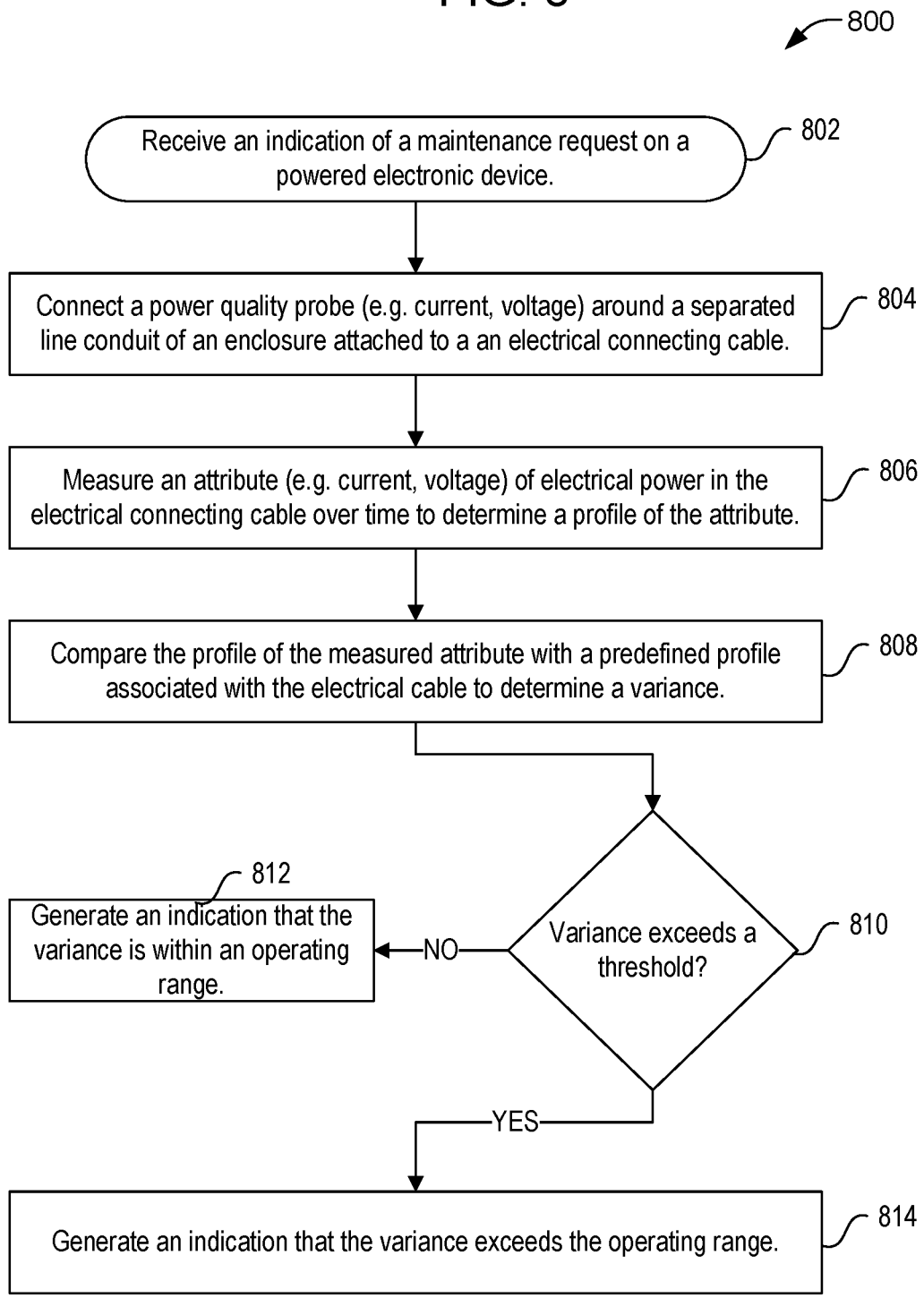
FIG. 8 illustrates an example process for detecting variance between a current or voltage profile (e.g. a frequency profile) in an electrical connecting cable using a power quality probe in conjunction with a line isolating power connector.

Embodiments of the line isolating power connectors described herein can also be used to facilitate measurement of total harmonic distortion, or other forms of interference. For example, FIG. 8 illustrates an example process 800 for measuring and quantifying distortion in an electrical connecting cable using a power quality probe in conjunction with a line isolating power connector, and in accordance with any of the embodiments of line isolating power connectors described herein. Steps shown in process 800 can be performed in conjunction with systems for maintaining operations in a datacenter or other suitable facility that includes any suitable degree of automation or on-demand maintenance scheduling. For example, according to various embodiments, an indication of a maintenance request can be received with reference to an electronic device (Act 802). While power is being supplied through the power cable to the electronic device, a power quality probe (e.g. a probe for measuring current, voltage, and/or signal) is connected around the line conduit of a line isolating power connector (Act 804), and the appropriate power attribute is detected (act 806). For measuring total harmonic distortion in a power supply cable, a contactless current sensor would be used to measure the current over time, resulting in a frequency profile; but other signals and profiles can be obtained. The profile of the measured attribute can then be compared with a predefined profile (e.g., a sin wave, a previously measured profile, an input signal, or other suitable baseline profile) to quantify the variance between the measured profile and the predetermined profile (Act 808). As applied to total harmonic distortion, the profile can include the relative amplitude of each harmonic relative to the amplitudes of the harmonics in an ideal signal.

According to some embodiments, the variance between the measured profile and predetermined profile can be compared to a threshold to determine whether the variance exceeds a threshold (Act 810). For example, excessive total harmonic distortion can be indicative of electromagnetic interference. Variance below the threshold can result in an indication that the power quality in the electrical connecting cable is within an operating range (Act 812), while variance above the threshold can cause the electrical connecting cable or associated electronics to be flagged as having variance that exceeds the operating range (Act 814), which may indicate additional maintenance.

Figure 9:
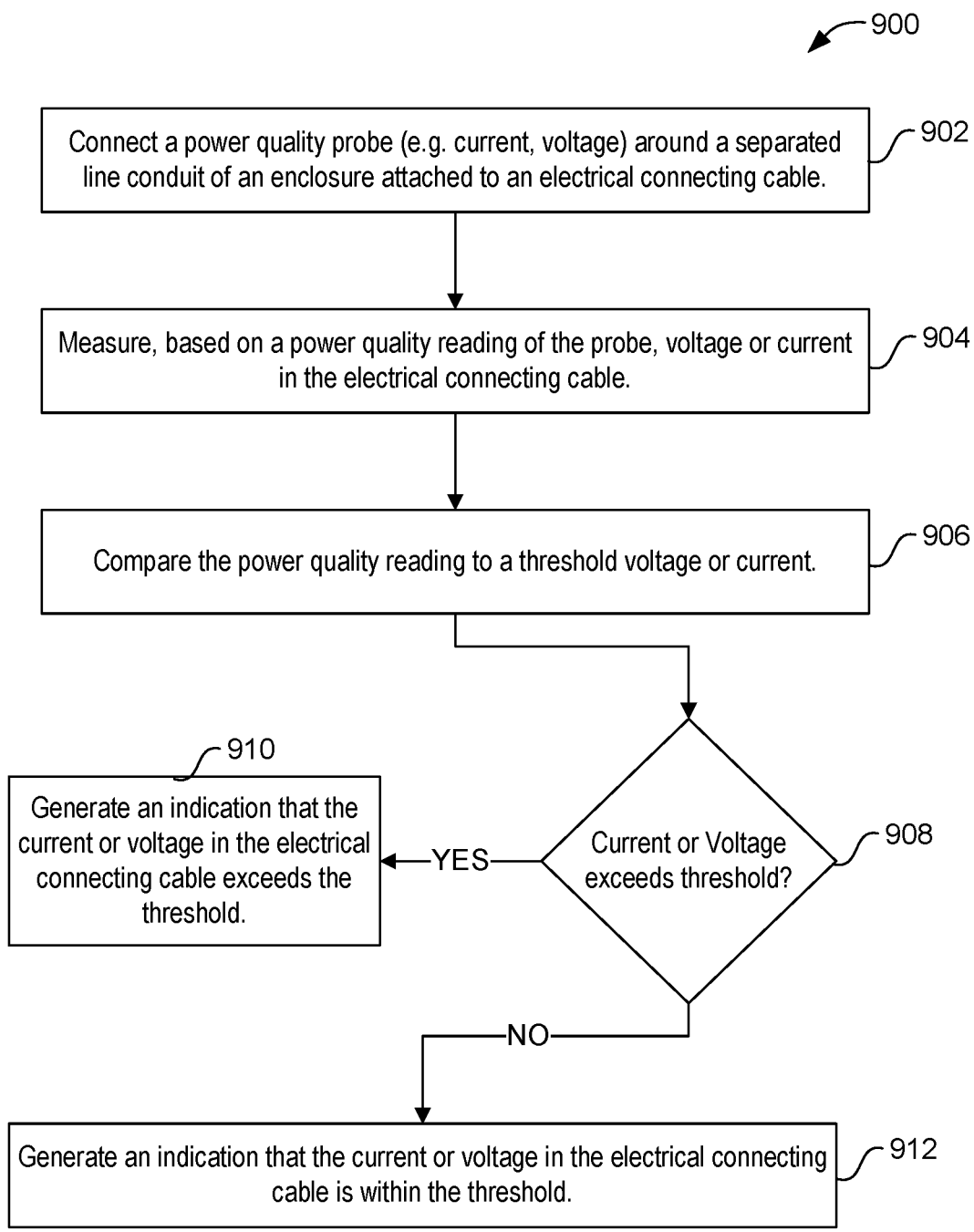
FIG. 9 illustrates an example process for quantifying current or voltage in an electrical connecting cable using a power quality probe in conjunction with a line isolating power connector.

Embodiments of the line isolating power connectors described herein can also be used to determine whether the current or voltage in a power supply cable is sufficiently low to permit safe handling, or for a particular application. For example, FIG. 9 illustrates an example process 900 for measuring and quantifying current or voltage in an electrical connecting cable using a power quality probe in conjunction with a line isolating power connector, and in accordance with any of the embodiments of line isolating power connectors described herein. Acts shown in process 900 can be performed in conjunction with systems for maintaining operations in a datacenter or other suitable facility that includes any suitable degree of automation or on-demand maintenance scheduling. For example, while power is being supplied through the power cable to the electronic device, a power quality probe (e.g. a probe for measuring current, voltage, and/or signal) is connected around the line conduit of a line isolating power connector (Act 902), and the amount of current and/or voltage is detected (act 904). This power quality reading (e.g. current, voltage) can be compared with a threshold voltage or current (e.g., a safe voltage or current, a target voltage or current associated with particular electronics or mechanical devices,) to determine whether the voltage or current is within a suitable range or exceeds the threshold (Act 908). A current or voltage below the threshold or within the operating range can result in an indication that the power quality in the electrical connecting cable is within an operating range (Act 912), while readings above the threshold or outside the operating range can cause the electrical connecting cable or associated electronics to be flagged as having exceeding the operating range (Act 910).

Some or all of the processes 700, 800, and 900 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for facilitating rapid detection of current in a multi-phase power cable, the system comprising:
   a multi-phase power outlet;
   the multi-phase power cable comprising a first line wire, a second line wire, and a neutral wire; and
   a line isolating power connector plugged into the multi-phase power outlet and coupled to the multi-phase power cable, wherein the line isolating power connector electrically connects the multi-phase power cable and the multi-phase power outlet, the line isolating power connector comprising:
      a housing comprising a first line wire conduit, a second line wire conduit, and a neutral wire conduit, wherein the first line wire conduit and the neutral wire conduit are separated by an aperture in the housing, wherein the second line wire conduit and the neutral wire conduit are separated by the aperture in the housing, wherein the first line wire conduit and the second line wire conduit are separated by the aperture in the housing, wherein the aperture is sized to receive a power quality probe around the first line wire conduit, and wherein the aperture is sized to receive the power quality probe around the second line wire conduit, wherein:
         the first line wire passes through the first line wire conduit;
         the second line wire passes through the second line wire conduit; and
         the neutral wire passes through the neutral wire conduit.

2. The system of claim 1, wherein the multi-phase power cable provides power to a plurality of computers.

3. The system of claim 1, further comprising an AC current probe operably connected with the first line wire conduit and positioned to detect current in the first line wire.

4. A line isolating power connector, comprising:
   a housing comprising:
      a cable end integrally connected with a multi-phase power cable comprising a first line wire, a second line wire, and a neutral wire;
      a plug end comprising a first line terminal, a second line terminal, and a neutral terminal configured to connect the line isolating power connector with a multi-phase power outlet;
      a first line conduit;
      a second line conduit;
      a neutral conduit; and
      an aperture, wherein the aperture separates the first line conduit and the neutral conduit, wherein the aperture separates the second line conduit and the neutral conduit, wherein the aperture separates the first line conduit and the second line conduit, wherein the aperture is sized to receive a power quality probe around the first line conduit, and wherein the aperture is sized to receive the power quality probe around the second line conduit;
      the first line wire extending through the first line conduit and electrically connected with the first line terminal;
      the second line wire extending through the second line conduit and electrically connected with the second line terminal; and
      the neutral wire extending through the neutral conduit and electrically connected with the neutral terminal.

5. The line isolating power connector of claim 4, wherein:
   the plug end further comprises a ground terminal;
   the line isolating power connector further comprises a ground wire; and
   the ground wire is positioned through the neutral conduit and electrically connected with the ground terminal.

6. The line isolating power connector of claim 4, wherein the aperture has a length of 2.5 cm to 6.25 cm (1" to 2.5") with respect to a longitudinal dimension of the housing.

7. The line isolating power connector of claim 4, wherein a cross section of the aperture comprises a circular shape, rectangular shape, elliptical shape, or elongated circular shape.

8. The line isolating power connector of claim 4, further comprising a power condition sensor connected with the first line conduit and operable to detect current in the first line wire and to illuminate in response to detecting the current in the first line wire.

9. The line isolating power connector of claim 4, wherein a length of the first line wire within the housing is unshielded over a nonzero distance less than 15 cm (6").

10. The line isolating power connector of claim 4, further comprising a contactless current sensor removably connected around the first line conduit and configured to display information related to a quantity of current flowing through the first line wire therein.

* * * * *